(12) United States Patent
Wu et al.

(10) Patent No.: US 8,305,754 B2
(45) Date of Patent: Nov. 6, 2012

(54) HEAT DISSIPATION STRUCTURE OF ELECTRONIC DEVICE

(75) Inventors: Hsi-Sheng Wu, Hsinchu County (TW);
Hsu-Cheng Chiang, Hsinchu (TW);
Kuo-Shu Hung, Changhua County (TW); Neng-Tan Lin, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 205 days.

(21) Appl. No.: 12/981,790

(22) Filed: Dec. 30, 2010

(65) Prior Publication Data
US 2012/0103571 A1    May 3, 2012

(30) Foreign Application Priority Data
Oct. 29, 2010   (TW) .............................. 99137343 A

(51) Int. Cl.
*H05K 7/20* (2006.01)
*H01L 23/427* (2006.01)
*G06F 1/20* (2006.01)

(52) U.S. Cl. .............. 361/688; 361/679.52; 361/679.53; 361/689; 361/699; 361/700; 361/701; 165/80.2; 165/80.5; 165/104.21; 165/104.33; 165/185

(58) Field of Classification Search ........... 361/679.46–679.54, 688, 689, 361/699–702, 715–717, 721–727; 165/80.2–80.5, 165/104.21, 104.26, 104.33, 104.34, 185; 62/3.2, 3.3, 3.7, 113, 332, 259.2; 174/15.1, 174/16.3, 252; 257/713–718; 312/223.2, 312/223.3, 236
See application file for complete search history.

(56) References Cited

U.S. PATENT DOCUMENTS

| | | | | |
|---|---|---|---|---|
| 5,768,103 | A | | 6/1998 | Kobrinetz et al. |
| 5,946,191 | A | * | 8/1999 | Oyamada ...................... 361/700 |
| 6,111,751 | A | * | 8/2000 | Sakuyama ..................... 361/704 |
| 6,388,882 | B1 | | 5/2002 | Hoover et al. |
| 6,457,321 | B1 | | 10/2002 | Patel et al. |

(Continued)

FOREIGN PATENT DOCUMENTS
JP   02010212533 A   *  9/2010

OTHER PUBLICATIONS

Chia-Jui Chen et al., "High Efficiency Plate Type Heat Pip", NARL Quartely, Jul. 2007, pp. 40-47, National Applied Research Laboratories, Taiwan, R.O.C.

(Continued)

*Primary Examiner* — Michail V Datskovskiy
(74) *Attorney, Agent, or Firm* — Rabin & Berdo, P.C.

(57) ABSTRACT

A structure of heat dissipation of an electronic device includes at least one heat pipe and a cooler. The heat pipe has a condensation end and an evaporation end opposite to each other, and the evaporation end is disposed on a heat generating element of the electronic device. The cooler is disposed on a rack and has a chamber therein, and the chamber has an inner shell having a cooling fluid therein. When the electronic device is mounted in the rack, the condensation end of the heat pipe is inserted into the cooler and positioned into the inner shell. The evaporation end absorbs the heat energy of the heat generating element, and transfers the heat energy to the condensation end, such that the cooling fluid dissipates the heat energy of the condensation end.

32 Claims, 12 Drawing Sheets

U.S. PATENT DOCUMENTS

| | | | |
|---|---|---|---|
| 6,519,955 B2 | 2/2003 | Marsala | |
| 6,643,132 B2* | 11/2003 | Faneuf et al. | 361/700 |
| 6,674,643 B2* | 1/2004 | Centola et al. | 361/720 |
| 6,776,221 B2 | 8/2004 | Montgomery et al. | |
| 6,796,372 B2* | 9/2004 | Bear | 165/104.21 |
| 7,012,807 B2* | 3/2006 | Chu et al. | 361/699 |
| 7,286,346 B2* | 10/2007 | Chiba et al. | 361/679.48 |
| 7,367,384 B2 | 5/2008 | Madara et al. | |
| 7,403,384 B2* | 7/2008 | Pflueger | 361/688 |
| 7,428,151 B2* | 9/2008 | Sonnabend et al. | 361/699 |
| 7,457,112 B2* | 11/2008 | Fukuda et al. | 361/679.48 |
| 7,564,685 B2 | 7/2009 | Clidaras et al. | |
| 7,719,837 B2* | 5/2010 | Wu et al. | 361/699 |
| 7,826,217 B2* | 11/2010 | Kondo et al. | 361/679.53 |
| 7,839,640 B2* | 11/2010 | Hayashi et al. | 361/699 |
| 7,936,560 B2* | 5/2011 | Toyoda et al. | 361/679.52 |
| 8,164,901 B2* | 4/2012 | Neudorfer | 361/699 |
| 2007/0042514 A1* | 2/2007 | Wu et al. | 438/17 |
| 2010/0002376 A1 | 1/2010 | Artman et al. | |

OTHER PUBLICATIONS

Hao-Min Kung et al., "Building and Verifying of Thermal Resistance Model of CPU Heatsink", Symposium of the 1st (2002)Taiwan Society of Heating, Refrigerating and Air-Conditioning Engineers, Jul. 2002, pp. 235-245, Taiwan Society of Heating, Refrigerating and Air-Conditioning Engineers, Taiwan, R.O.C.

Song-Hao Wang et al., "An Innovative Active Liquid Heat Sink Technology for CPU Cooling System", Journal of Advanced Engineering vol. 4, No. 1, pp. 83-88 / Jan. 2009.

Meng-Hao Chen et al., "Gravity Effect on the Thermal Performance of Flat Plate Heat Pipe (FPHP)", Journal of Advanced Engineering vol. 3, No. 3, pp. 205-208 / Jul. 2008.

Zhang Ya-ping et al., "Thermal Performance Analysis of Heat Pipe Used in Electronics Cooling", Fluid Machinery, vol. 36, No. 8, pp. 79-82, 2008.

\* cited by examiner

HEAT DISSIPATION STRUCTURE OF ELECTRONIC DEVICE

CROSS-REFERENCE TO RELATED APPLICATIONS

This non-provisional application claims priority under 35 U.S.C. §119(a) on Patent Application No(s). 099137343 filed in Taiwan, R.O.C. on Oct. 29, 2010, the entire contents of which are hereby incorporated by reference.

BACKGROUND

1. Field

The present disclosure relates to a heat dissipation structure of an electronic device, and more particularly to a heat dissipation structure of a server device for heat dissipation using a cooling fluid.

2. Related Art

At present, a heat dissipation module used for a central processing unit (CPU) of a server generally employs a heat sink structure. The principle is using a large contact area between the heat sink and the air, and using heat convection to help the heat dissipation of the CPU. However, the heat dissipation problem of other electronic elements is relatively caused while the heat sink dissipates the heat of CPU.

For example, when airflow flows through the CPU and removes the heat energy generated by the CPU, the temperature of the airflow is raised, and such high-temperature airflow is adverse to the heat dissipation of other electronic elements. Therefore, in order to overcome the problem above, the flow rate of the airflow needs to be enhanced, that is, the power of an air supply device for heat dissipation needs to be improved to enhance the air exhaust rate. However, the system load is caused to be relatively increased if the power of the air supply device for heat dissipation is improved. Moreover, the smaller volume of the server results in the smaller inner spacing for circulating of the airflow, and thus the heat dissipation effect using heat convection becomes much poorer. However, as required by information explosion, the circuit integration degree of a circuit board in a server will necessarily be increased in order to improve the operation efficiency of the server to a higher level. Therefore, the space in the server will be filled with more electronic elements and becomes congested, and thus excessive accumulation of the heat energy is caused. In view of this, the cooling or temperature drop manners of the server must be further improved, so as to meet the heat dissipation demand of high heat energy generated by a server due to high operation efficiency.

In order to overcome the problems above, the improvement of the heat dissipation mode of the heat pipe is necessary. As design theory of a heat pipe for transferring heat is not cooling or lowering the temperature by using air, the space for flowing of airflow does not need to be considered. Therefore, the volume of a server can be designed to be much smaller, and the system air pressure drop may also be reduced, so as to solve the problem of energy consumption.

For example, in U.S. Pat. No. 6,388,882 (referred to as '882 hereinafter), an evaporation end of a heat pipe is disposed on a CPU of a main board, so as to enable the evaporation end to transfer the heat energy to a condensation end of the heat pipe. When the main board is disposed in a rack of the server, the condensation end of the heat pipe contacts with a cooler disposed on the server cabinet, and the cooler dissipates the heat energy on the condensation end.

However, the condensation end of the heat pipe in '882 is engaged in a groove in the cooler to contact the heat pipe with the cooler. Furthermore, heat conduction effect is achieved between the condensation end and the cooler in a solid-solid contact manner. However, in order ensure the efficiency of heat conduction, the condensation end and the groove in the cooler must be made of materials having a high thermal conductivity, for example, metal material such as copper. As a result, the condensation end and the cooler are combined in a rigid body to rigid body contact. That is to say, heat conduction is generated between the condensation end and the cooler using surface contact of rigid body to rigid body, thereby removing the heat energy. Therefore, when the condensation end is mated with the cooler, if a gap therebetween is too large, the heat dissipation effect is easily caused to be poor due to the incomplete contact between the condensation end and the cooler. Alternatively, if the mating gap between the condensation end and the cooler is too small, interference and collision with each other easily occur, thereby causing the damage.

SUMMARY

In view of the problems above, the present disclosure is a heat dissipation structure of an electronic device, so as to solve the problem existing in the prior art of unobvious heat dissipation effect caused by the poor contact of a heat pipe with a cooler or damage caused by the collision of the heat pipe and the cooler.

The heat dissipation structure of the electronic device according to the present disclosure is used to dissipate heat energy of a heat generating element of at least one electronic device removably disposed in a rack. The heat dissipation structure of the electronic device comprises at least one heat pipe and a cooler. The heat pipe has a condensation end and an evaporation end opposite to each other, and the evaporation end is disposed on the heat generating element. The cooler is disposed on the rack, and has a shell, a inner shell, a cooling fluid, and a combining hole. The shell has a chamber therein, the inner shell is disposed in the chamber, and the cooling fluid is disposed in the inner shell. In addition, the combining hole is disposed on the shell, and communicates with the chamber. When the electronic device is mounted in the rack, the condensation end of the heat pipe is inserted into the chamber through the combining hole and positioned in the inner shell. Moreover, the evaporation end absorbs the heat energy of the heat generating element, and transfers the heat energy to the condensation end, such that the cooling fluid dissipates the heat energy of the condensation end.

The heat dissipation structure of the electronic device according to the present disclosure is used to dissipate the heat energy of a heat generating element of at least one electronic device removably disposed in a rack. The heat dissipation structure of the electronic device comprises at least one heat pipe and a cooler. The heat pipe has a condensation end and an evaporation end opposite to each other, and the evaporation end is disposed on the heat generating element. The cooler is disposed on the rack, and has a shell, a cooling fluid, and a combining hole. The shell has a chamber therein, and the cooling fluid is disposed in the chamber. The combining hole is disposed on the shell, and communicates with the chamber. When the electronic device is mounted in the rack, the condensation end of the heat pipe is inserted into the chamber through the combining hole. The evaporation end absorbs the heat energy of the heat generating element, and transfers the heat energy to the condensation end, such that the cooling fluid dissipates the heat energy of the condensation end.

The heat dissipation structure of the electronic device according to the present disclosure is used to dissipate the heat energy of a heat generating element of at least one electronic device removably disposed in a rack. The heat dissipation structure of the electronic device comprises at least one heat pipe and a cooler. The heat pipe has a condensation end and an evaporation end opposite to each other, and the evaporation end is disposed on the heat generating element. The cooler is disposed on the rack, and has a shell, a cooling fluid, a combining hole, and a through hole. The shell has a chamber therein, and the chamber has a wall which divides the chamber into a cooling chamber and an isolation chamber. The cooling fluid is disposed in the cooling chamber. The combining hole is disposed on the shell, and communicates with the isolation chamber. The through hole is disposed on the wall, and communicates with the cooling chamber. When the electronic device is mounted in the rack, the condensation end of the heat pipe is inserted into the cooling chamber sequentially through the combining hole and the through hole. The evaporation end absorbs the heat energy of the heat generating element, and transfers the heat energy to the condensation end, such that the cooling fluid dissipates the heat energy of the condensation end.

According to the heat dissipation structure of the electronic device according to the present disclosure, the condensation end of the heat pipe is directly inserted in the chamber of the cooler. The condensation end directly exchanges heat with the cooling fluid, so as to achieve desired heat dissipation efficiency. Moreover, even though there is mating tolerance between the heat pipe and the cooler, it can be ensured that the condensation end is kept to be immersed in the cooling fluid, as long as the condensation end is positioned in the chamber. Therefore, the problem existing in the prior art of unobvious heat dissipation effect caused by the poor contact of the heat pipe with the cooler can be effectively solved by the heat dissipation structure of the electronic device according to the present disclosure.

These and other aspects of the present disclosure will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the disclosure and, together with the written description, serve to explain the principles of the disclosure. Wherever possible, the same reference numbers are used throughout the drawings to refer to the same or like elements of an embodiment, and wherein.

DETAILED DESCRIPTION

Figure 1A:
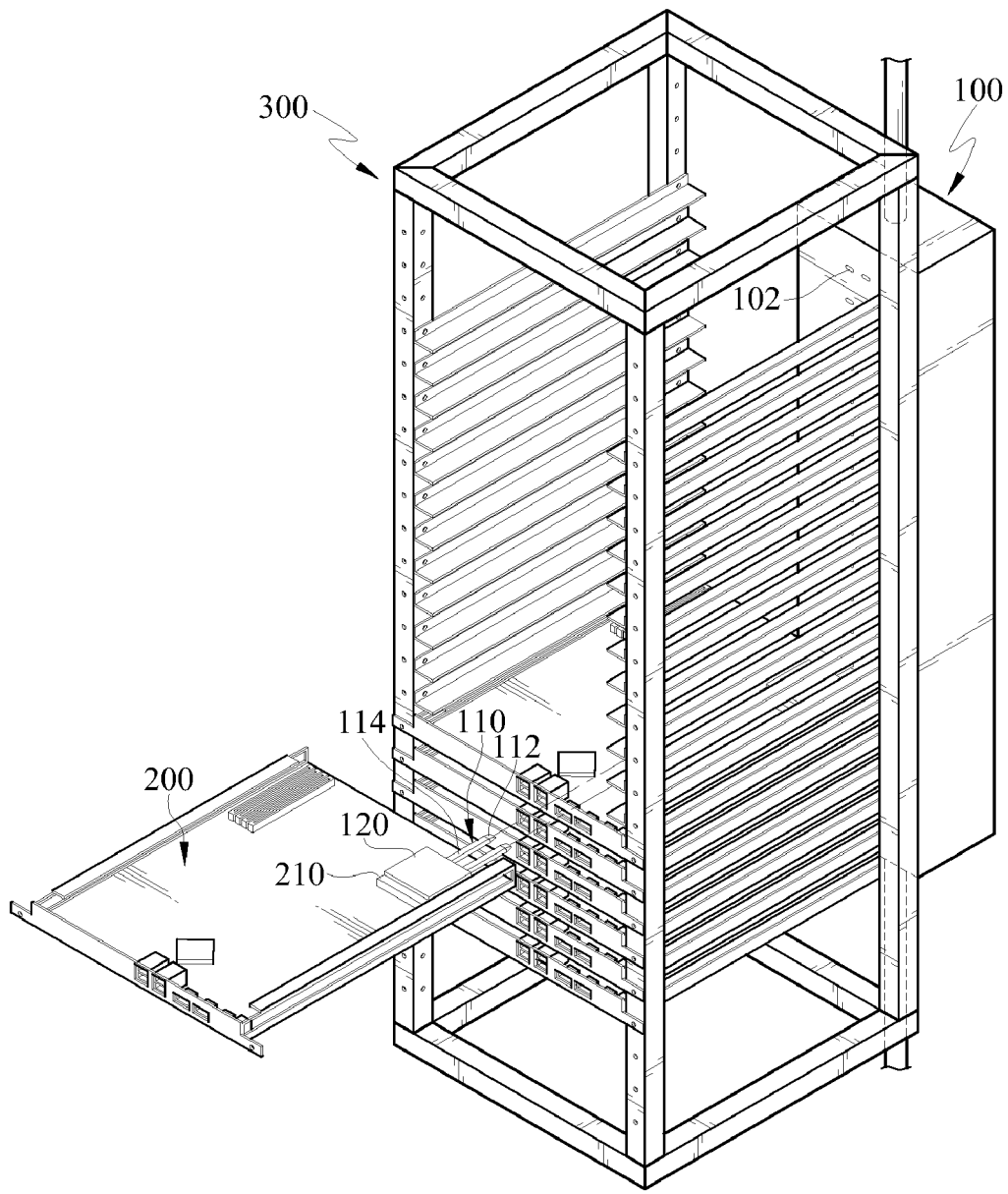
FIG. 1A is a schematic structural view of a heat dissipation structure of an electronic device according to an embodiment of the present disclosure.
Figure 2A:
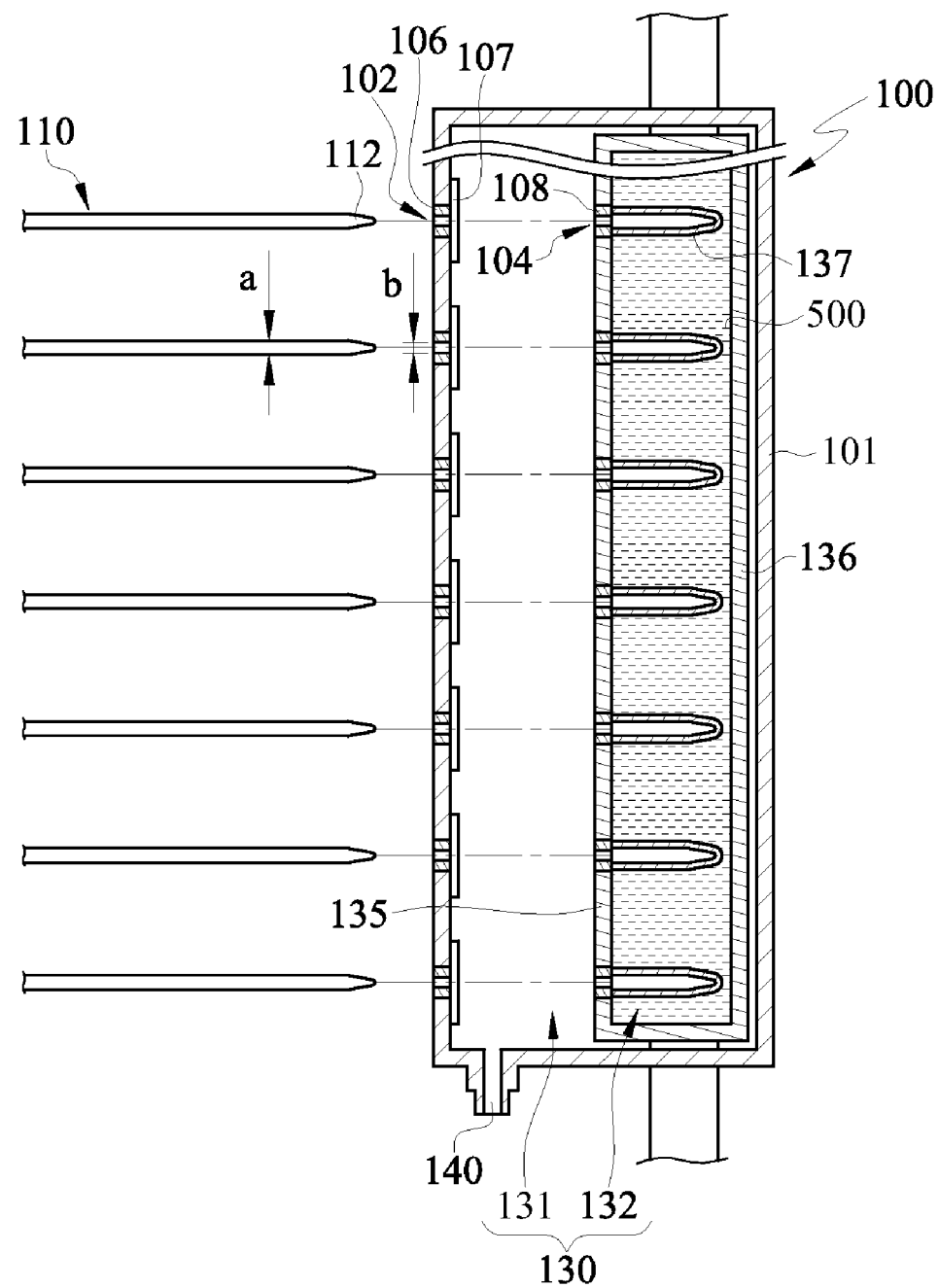
FIG. 2A is a cross-sectional view of a heat pipe and a cooler according to an embodiment of the present disclosure.

FIG. 1A is a schematic structural view of a heat dissipation structure of an electronic device according to an embodiment of the present disclosure, and FIG. 2A is a cross-sectional view of a heat pipe and a cooler according to an embodiment of the present disclosure.

The heat dissipation structure of the electronic device according to the embodiment of the present disclosure is used to dissipate the heat energy of a heat generating element 210 of at least one electronic device 200. In addition, the electronic device 200 is removably disposed in a rack 300.

In this embodiment, the electronic device 200 and the heat generating element 210 are described with a server and a CPU on a main board of the server as examples, and the rack 300 is described with a server cabinet for mounting the server as example; however, the above examples are not intended to limit the present disclosure. As shown in FIG. 1A, the rack 300 (server cabinet) is mounted with a plurality of electronic devices 200 (servers) stacked from top to bottom therein. For easy of illustration, hereinafter, the description is made according to the heat dissipation structure of one electronic device 200 (server) among them.

Figure 1B:
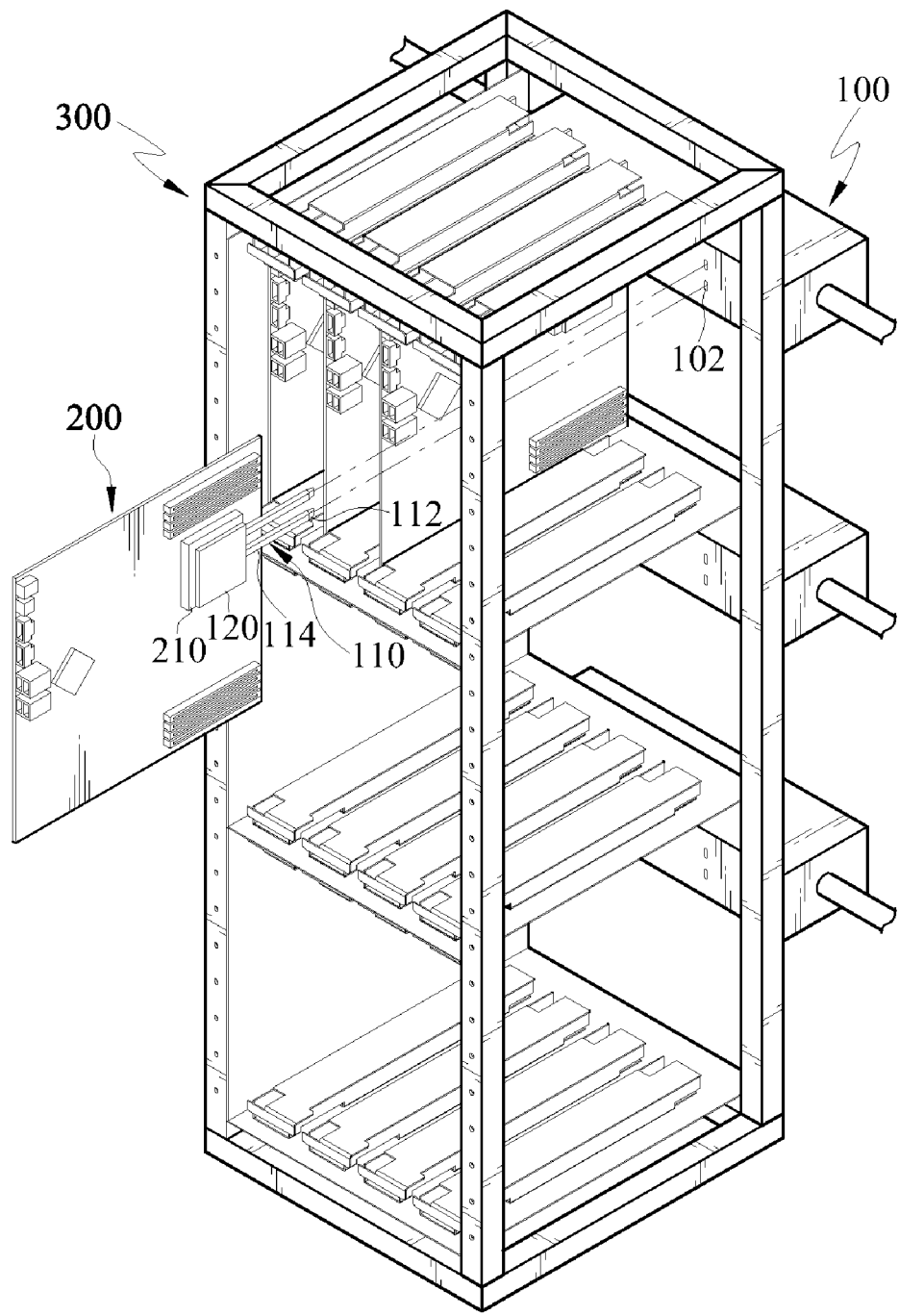
FIG. 1B is a schematic structural view of a heat dissipation structure of an electronic device according to another embodiment of the present disclosure.
Figure 1C:
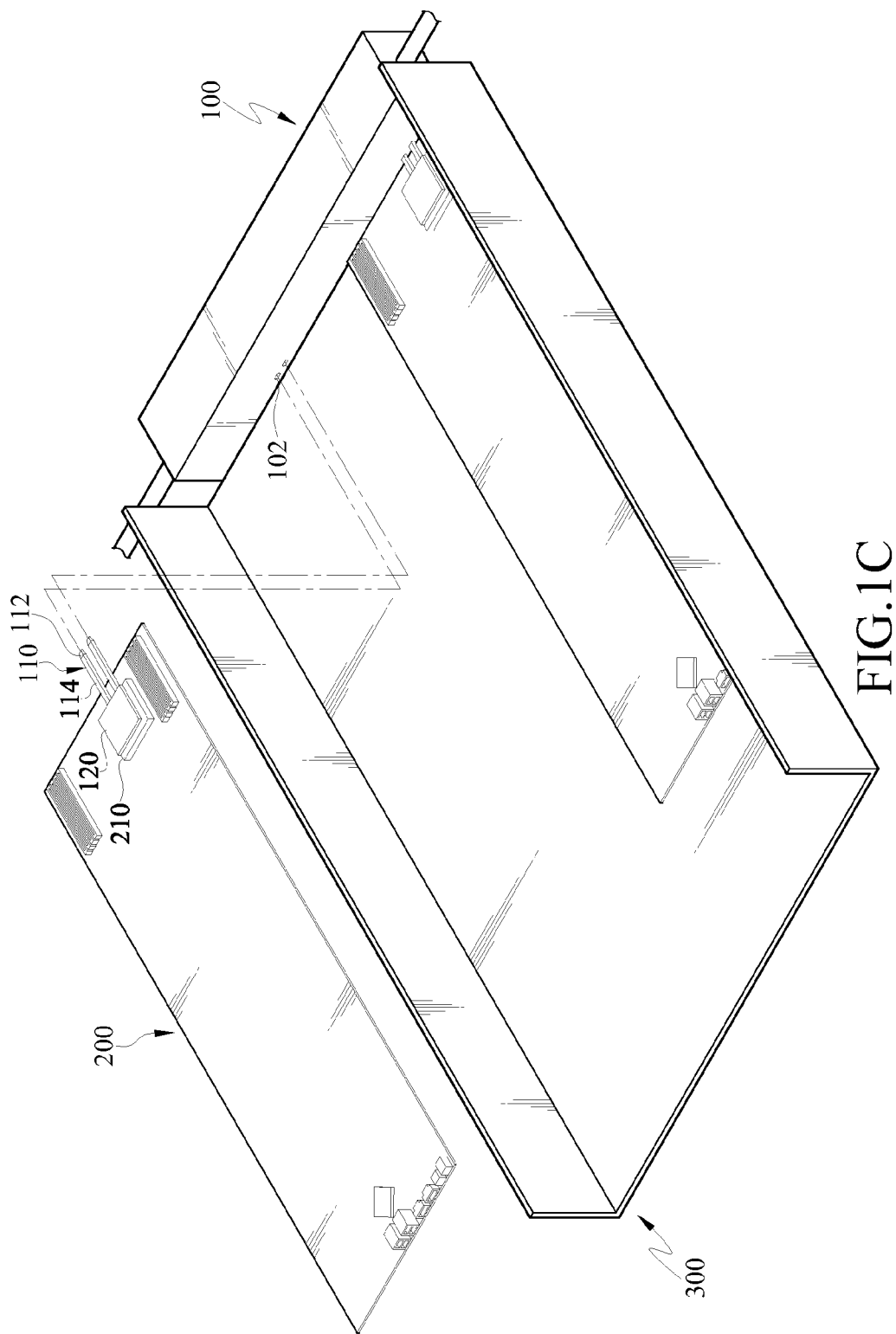
FIG. 1C is a schematic structural view of a heat dissipation structure of an electronic device according to another embodiment of the present disclosure.

It should be noted that according to this embodiment, the plurality of electronic devices 200 (servers) mounted in the rack 300 (server cabinet) are stacked from top to bottom, but this stack configuration is not intended to limit the present disclosure. For example, the plurality of electronic devices 200 (servers) mounted in the rack 300 (server cabinet) may be disposed from left to right side by side, for instance, the common blade server (as shown in FIG. 1B). It should be noted that the position of a cooler 100 is not intended to limit the present disclosure, and may be, but not limited to, inside the rack 300 or on a side thereof. Furthermore, the electronic device 200 (server) mounted in the rack 300 according to this embodiment may be only one, for instance, a single server (as shown in FIG. 1C), such as 1U server, 2U server, or 4U server.

The heat dissipation structure of the electronic device according to this embodiment comprises a heat pipe 110 and a cooler 100, and the heat pipe 110 has a condensation end 112 and an evaporation end 114 opposite to each other. In addition, the heat dissipation structure of the electronic device according to this embodiment further comprises a cold plate 120 disposed on the heat generating element 210. The cold plate 120 may contact with the heat generating element 210; however, this configuration is not intended to limit the present disclosure. For example, the cold plate 120 may be further disposed above the heat generating element 210, and keeps a certain distance from the heat generating element 210, that is, the cold plate 120 does not contact with the heat generating element 210, such that the heat generating element 210 transfers the heat energy to the cold plate 120 by means of heat irradiation. Moreover, the evaporation end 114 of the heat pipe 110 is connected to the cold plate 120, such that the cold plate 120 transfers the heat energy generated by the heat generating element 210 to the evaporation end 114.

Figure 1D:
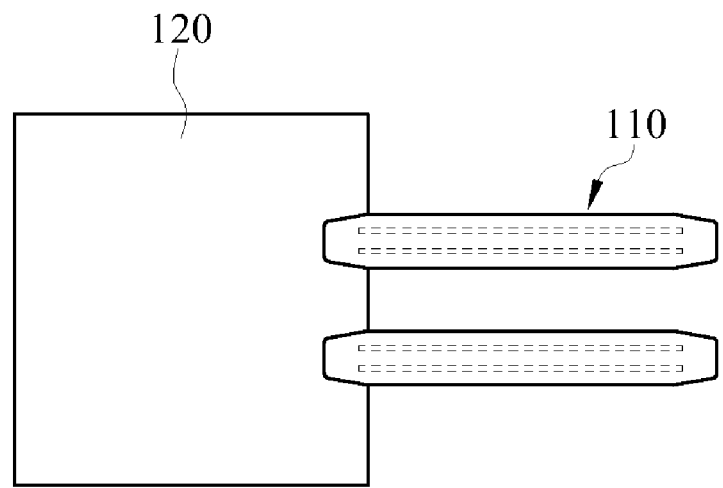
FIG. 1D is a schematic structural view of a heat pipe according to an embodiment of the present disclosure.
Figure 1E:
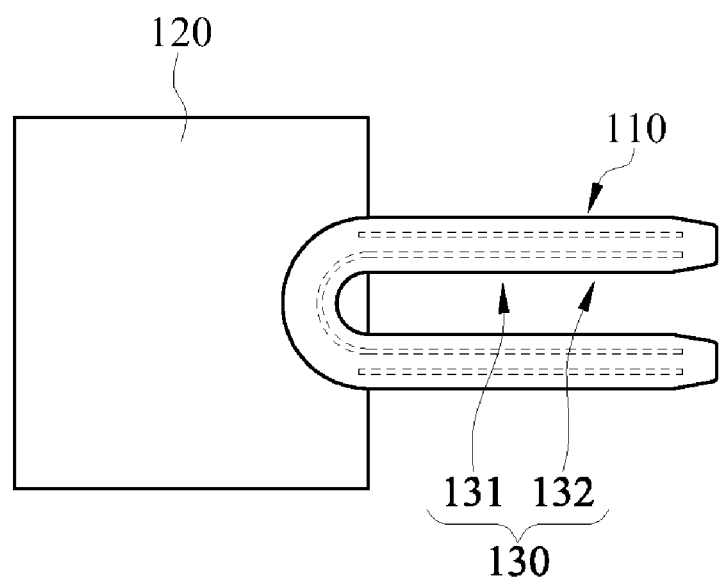
FIG. 1E is a schematic structural view of a heat pipe according to another embodiment of the present disclosure.

The cold plate 120 may use the material of high thermal conductivity, for example, copper alloy material, so as to have a good heat transfer effect between the heat generating element 210 and the heat pipe 110. Furthermore, the heat pipe 110 may have a configuration of a common single heat pipe (as shown in FIG. 1D), or have a configuration in which the condensation end is a combination of a plurality of single pipes communicating with one another, and then connected through a loop to the evaporation end, so as to form a loop heat pipe (LHP) (as shown in FIG. 1E). It should be noted that as the LHP may be of various forms, what is shown in FIG. 1E is only an example for reference, but not intended to limit the present disclosure. In addition, the heat pipe is not limited to be round pipe-shaped, and may be flat pipe-shaped or polygonal pipe-shaped.

Referring to FIGS. 1A and 2A, the cooler 100 in this embodiment is disposed on the rack 300. The cooler 100 has a shell 101, an inner shell 136, a cooling fluid 500, and a combining hole 102. The shell 101 has a chamber 130 therein, and the combining hole 102 is disposed on the shell 101, and communicates with the chamber 130. The inner shell 136 is disposed in the chamber 130, such that an isolation chamber 131 is formed in the chamber 130. The inner shell 136 further has a cooling chamber 132 and a through hole 104. The through hole 104 communicates with the cooling chamber 132, and corresponds to the combining hole 102, that is, the through hole 104 and the combining hole 102 are coaxial. The cooling fluid 500 is disposed in the cooling chamber 132. The cooling fluid 500 may enter in or exit from the cooling chamber 132 in the inner shell 136 by flowing. The cooling fluid 500 may be cooling water, or a liquid coolant, and any suitable cooling fluid may be used by persons of skill in the art, which is not limited to the embodiments disclosed in the present disclosure.

It should be noted that the shell 101 and the inner shell 136 may be, but not limited to, round pipe-shaped, rectangular pipe-shaped, or triangular pipe-shaped. In addition, a cooling fluid supply pipe is connected to the opposite two ends of the inner shell 136, which is externally connected to cooling fluid supply system (not shown). The cooling fluid supply system allows the cooling fluid 500 to enter in or exit from the cooling chamber 132 of the inner shell 136 through the cooling fluid supply pipe. Moreover, the cooling fluid supply pipe may have a cross-sectional area lower than, or equal to that of the inner shell 136.

Figure 2B:
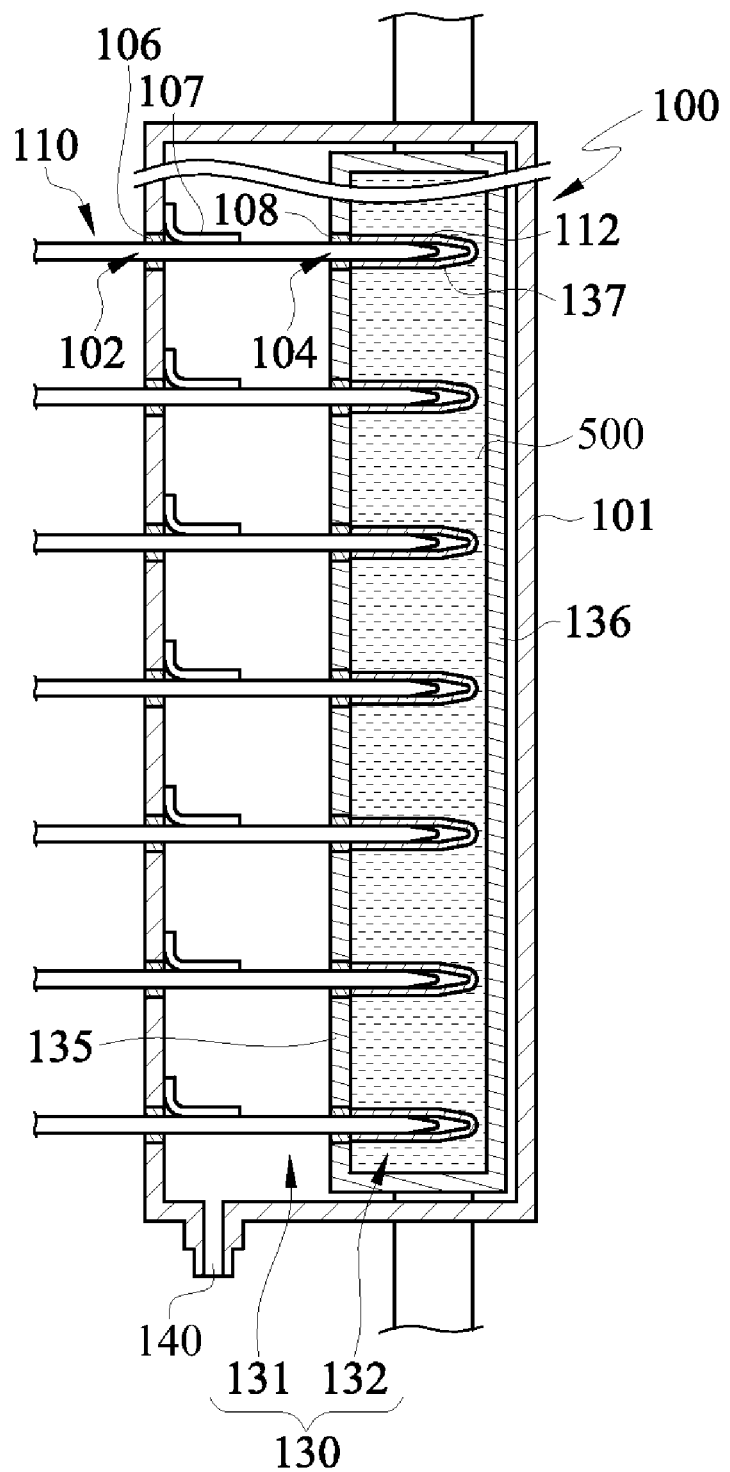
FIG. 2B is a cross-sectional view of a heat pipe and a cooler according to an embodiment of the present disclosure.

When the electronic device 200 is mounted in the rack 300, the condensation end 112 of the heat pipe 110 is inserted sequentially into the combining hole 102 and the through hole 104, and positioned in the cooling chamber 132 (as shown in FIG. 2B). In this case, the evaporation end 114 absorbs the heat energy of the heat generating element 210, and transfers the heat energy to the condensation end 112. The cooling fluid 500 exchanges heat with the condensation end 112 to remove the heat energy.

As in this embodiment, the inner shell 136 is positioned in the chamber 130, the condensed water drop (water globule) generated on a surface of the inner shell 136 due to temperature difference may be isolated in the chamber 130, so as to avoid the damage caused by leakage of the condensed water drop (water globule) to the electronic device 200.

In this embodiment, the heat dissipation structure of the electronic device may further comprise a first protection gasket 106 and a second protection gasket 108. The first protection gasket 106 and the second protection gasket 108 are elastic rings made of rubber or silicone, but the present disclosure is not limited thereto. The first protection gasket 106 is mounted in the combining hole 102, and the second protection gasket 108 is mounted in the through hole 104. The condensation end 112 is extended through the first protection gasket 106 to enter into the isolation chamber 131 through the chamber 130, and extended through the through hole 104 and to enter into the cooling chamber 132. Moreover, the first protection gasket 106 and the second protection gasket 108 have an inner diameter b, which is slightly lower than an outer diameter a of the condensation end 112 of the heat pipe 110. In other words, a close fit configuration is formed between the condensation end 112 and the first protection gasket 106 and the second protection gasket 108. In this way, the cooler 100 allows the heat pipe 110 to be closely inserted into the combining hole 102 and the through hole 104 by additionally disposing the first protection gasket 106 and the second protection gasket 108, so as to avoid the leakage of the cooling fluid 500 due to the gap existing between the heat pipe 110 and the combining hole 102 or the through hole 104. When the condensation end 112 is drawn away from the chamber 130, the first protection gasket 106 may further scrub off the cooling fluid 500 remaining on the condensation end 112, so as to avoid the damage caused by the leakage of the cooling fluid 500 to the electronic elements. In addition, the first protection gasket 106 has elasticity, thus providing a buffer effect in inserting the heat pipe 110 into the cooler 100. Therefore, using such a structure design, the damage of the heat pipe 110 due to collision caused by the combination configuration of rigid body to rigid body between the heat pipe 110 and the cooler 100 can be avoided.

Moreover, in this embodiment, the shell 101 may further have a water outlet 140, which communicates with the chamber 130, and is used to discharge the liquid remaining in drawing of the condensation end 112 from the chamber 130.

In addition, in this embodiment, the heat dissipation structure of the electronic device may further comprise a first one-way valve 107. The first one-way valve 107 may be an elastic trip made of rubber; however, the present disclosure is not limited thereto. The first one-way valve 107 is disposed in the chamber 130, and optionally covers the combining hole 102. Further, the first one-way valve 107 is fixed in the chamber 130 at one end, and the other end covers the combining hole 102. As the first one-way valve 107 is a elastic trip, the end covering the combining hole 102 can move freely under an external force. Therefore, without any external force, the first one-way valve 107 covers the combining hole 102 and thus shows a closed state, as shown in FIG. 2A. As a result, the cooling fluid 500 or a liquid generated by air condensation in the chamber 130 can be prevented from flowing out of the chamber 130 through the combining hole 102. When the condensation end 112 of the heat pipe 110 is inserted in the combining hole 102, the condensation end 112 pushes the first one-way valve 107 away, and then extends into the chamber 130. As such, the first one-way valve 107 is still fixed in the chamber 130 at one end, and the other end previously covering the combining hole 102 is elevated under the action of an external force. In contrast, when the condensation end 112 is drawn out of the chamber 130, the first one-way valve 107 automatically returns to the closed state, so as to close the combining hole 102. It should be noted that in this embodiment, the first one-way valve 107 is made of an elastic material; however, the present disclosure is not limited thereto. For example, the first one-way valve 107 may further be a metal flap, which is pivotally fixed in the chamber 130, and normally covers the combining hole 102 by gravity or by additionally disposing a torsion spring. In addition, the number of the first one-way valve 107 is not limited in the present disclosure, for example, two first one-way valves 107 may also be disposed to collectively cover the combining hole 102.

Furthermore, in this embodiment, the inner shell 136 further has a sheath 137, which is disposed in the cooling chamber 132, and communicates with the through hole 104. The sheath 137 isolates the cooling fluid 500 in the inner shell 136, such that the cooling fluid 500 cannot flow out through the through hole 104. When the condensation end 112 is inserted into the cooling chamber 132, the condensation end 112 is wrapped by the sheath 137 (as shown in FIG. 2B), and exchanges heat with the cooling fluid 500 by heat conduction. The length of the sheath 137 needs to be greater than the length of the condensation end 112 inserted into the cooling chamber 132, thereby avoiding the occurrence of damage caused by collision of the sheath 137 with the condensation end 112.

Figure 3A:
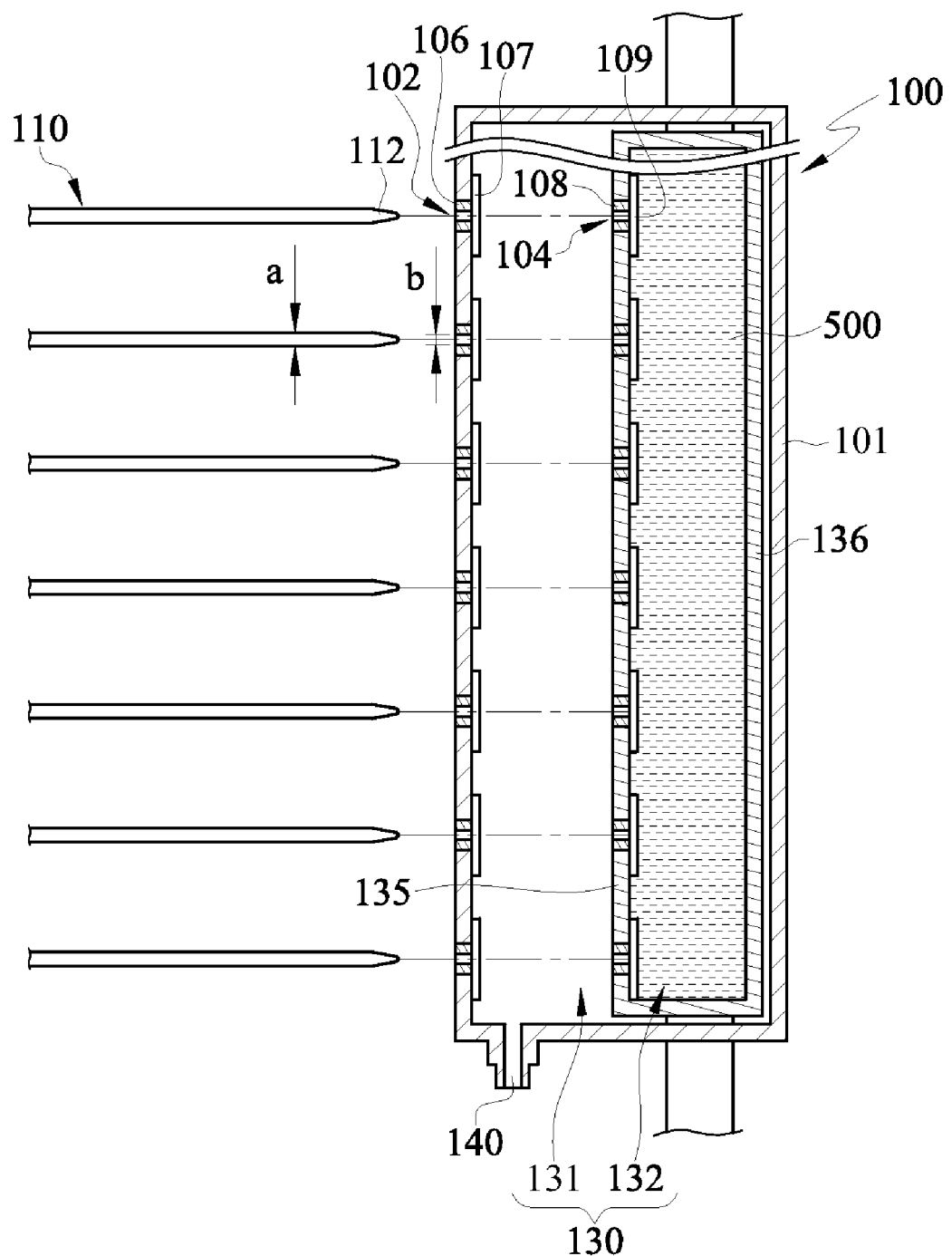
FIG. 3A is a cross-sectional view of a heat pipe and a cooler according to another embodiment of the present disclosure.
Figure 3B:
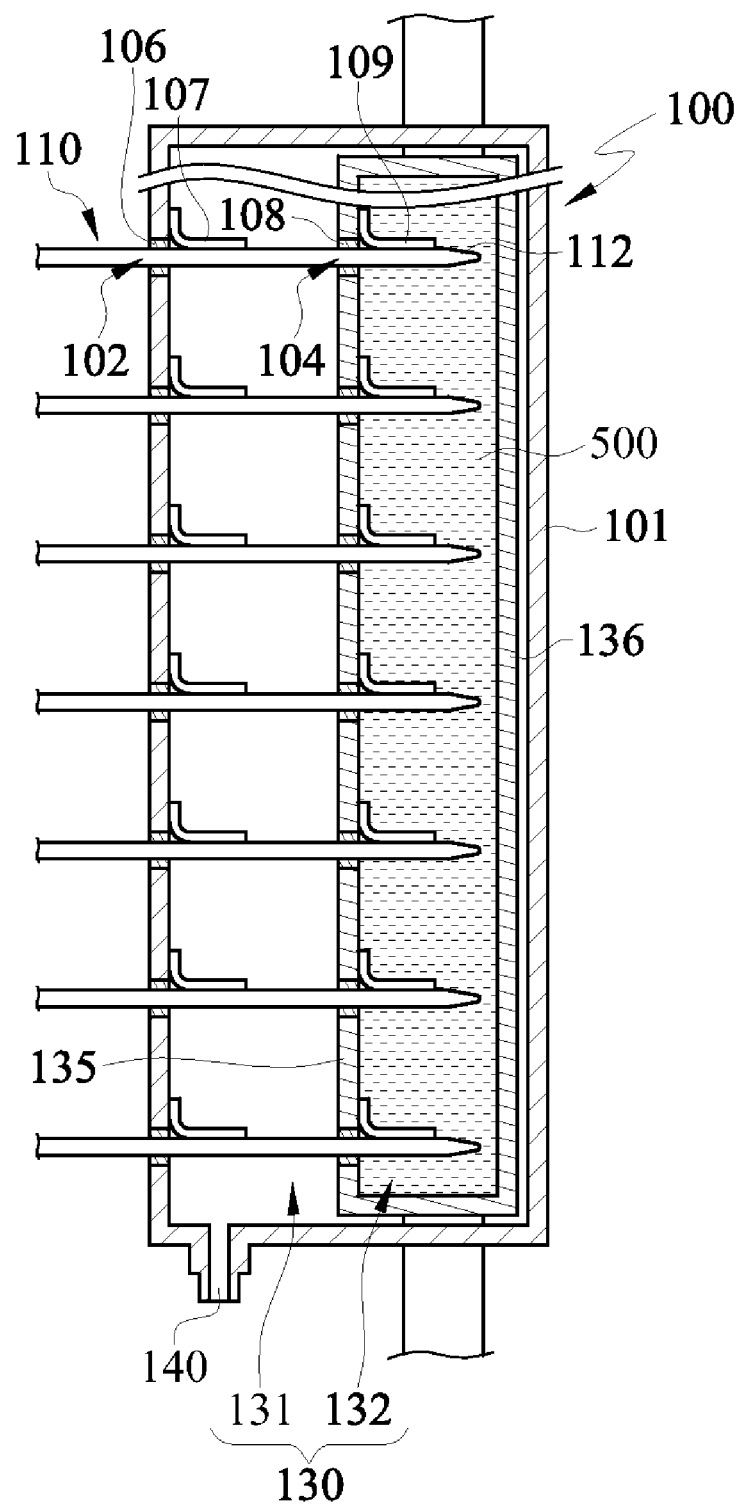
FIG. 3B is a cross-sectional view of a heat pipe and a cooler according to another embodiment of the present disclosure.

FIGS. 3A and 3B are cross-sectional views of a heat pipe and a cooler according to another embodiment of the present disclosure. Referring to FIGS. 3A and 3B in combination with FIG. 1A, as the structure in this embodiment is substantially the same as those in the embodiments as shown in FIGS. 2A and 2B, description is only made according to differences therebetween.

In this embodiment, a cooler 100 is disposed on a rack 300. The cooler 100 has a shell 101, an inner shell 136, a cooling fluid 500, and a combining hole 102. The shell 101 has a chamber 130 therein, and the combining hole 102 is disposed on the shell 101, and communicates with the chamber 130. The inner shell 136 is disposed in the chamber 130, such that an isolation chamber 131 is formed in the chamber 130. The inner shell 136 further has a cooling chamber 132 and a through hole 104. The shell 101 and the inner shell 136 may be, but not limited to, round pipe-shaped, rectangular pipe-shaped, or triangular pipe-shaped. The through hole 104 communicates with the cooling chamber 132, and corresponds to the combining hole 102, that is, the through hole 104 and the combining hole 102 are coaxial. The cooling fluid 500 is disposed in the cooling chamber 132.

In this embodiment, the heat dissipation structure of the electronic device further comprises a second one-way valve 109. The second one-way valve 109 may be an elastic trip made of rubber; however, the present disclosure is not limited thereto. The second one-way valve 109 is disposed in the cooling chamber 132, and optionally covers the through hole 104. Without any external force, the second one-way valve 109 covers the through hole 104 and thus shows a closed state, as shown in FIG. 3A. As a result, the cooling fluid 500 in the cooling chamber 132 can be prevented from flowing out of the cooling chamber 132 through the through hole 104. When a condensation end 112 of the heat pipe 110 is inserted in the through hole 104 through the combining hole 102, the condensation end 112 pushes the second one-way valve 109 away, and then extends into the cooling chamber 132. As such, the second one-way valve 109 is still fixed in the cooling chamber 132 at one end, and the other end previously covering the through hole 104 is elevated under the external force, as shown in FIG. 3B.

In this embodiment, the condensation end 112 extends through the through hole 104 to be directly immersed in the cooling fluid 500 in the cooling chamber 132, such that the cooling fluid 500 can thoroughly contact with the condensation end 112. Therefore, good contact effect can be achieved between the cooling fluid 500 and the condensation end 112, as long as the condensation end 112 is ensured to be positioned in the cooling chamber 132, even though there is mating tolerance between the heat pipe 110 and the cooler 100. Accordingly, the problem existing in the prior art of unobvious heat dissipation effect caused by the poor contact of the heat pipe with the cooler can be avoided by the heat dissipation structure of the electronic device according to this embodiment.

Figure 4:
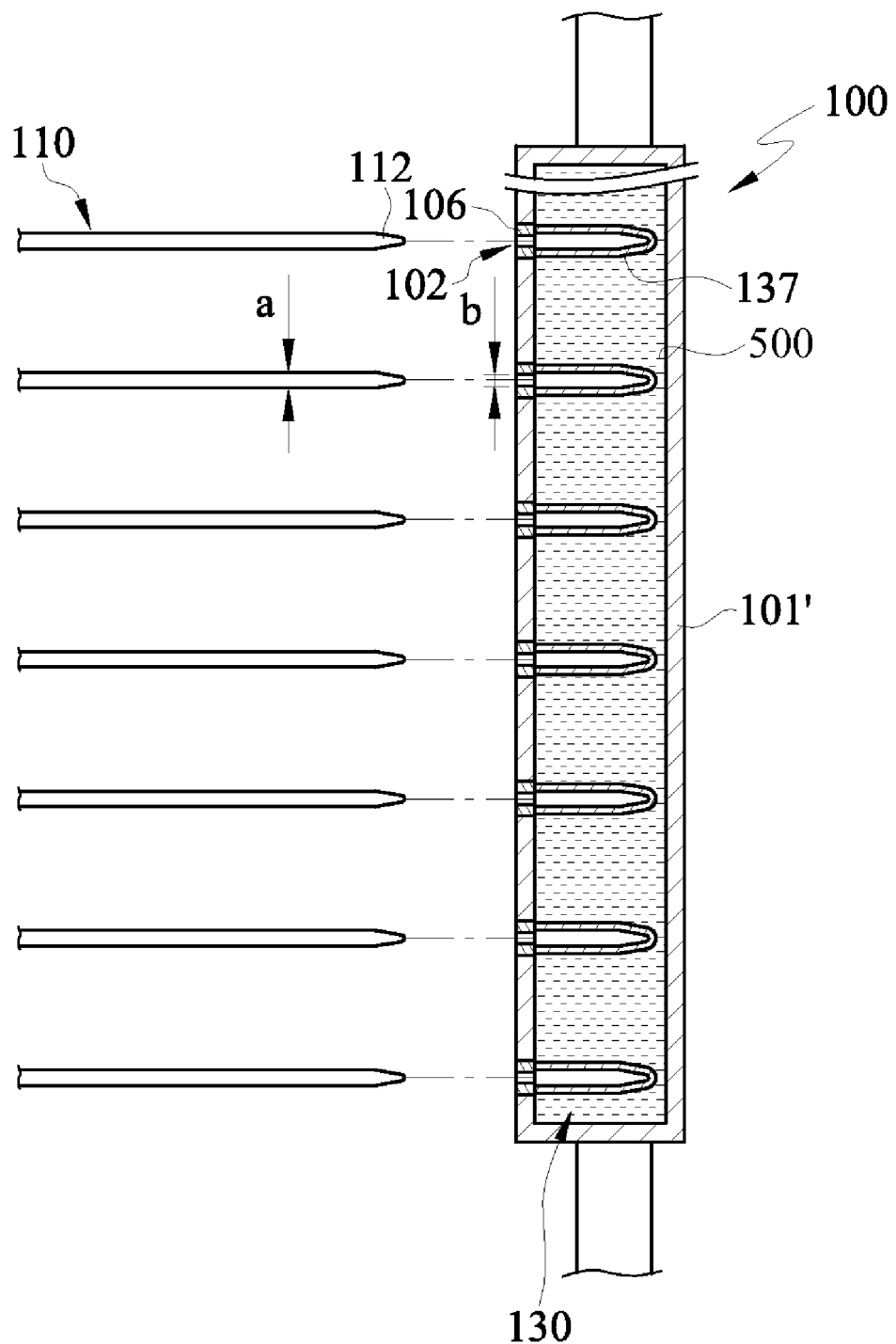
FIG. 4 is a cross-sectional view of a heat pipe and a cooler according to another embodiment of the present disclosure.

FIG. 4 is a cross-sectional view of a heat pipe and a cooler according to another embodiment of the present disclosure. Referring to FIG. 4 in combination with FIG. 1A, as the structure in this embodiment is substantially similar to that in the embodiment as shown in FIG. 3A, description is only made according to differences therebetween.

In this embodiment, a cooler 100 is disposed on a rack 300. The cooler 100 has a shell 101', a cooling fluid 500, and a combining hole 102. The shell 101' has a chamber 130 therein, and the combining hole 102 is disposed on the shell 101', and communicates with the chamber 130. The cooling fluid 500 is disposed in the chamber 130. The cooling fluid 500 may enter in or exit from the chamber 130 by flowing. The cooling fluid 500 may be cooling water, or a liquid coolant, and any suitable cooling fluid may be used by persons of skill in the art, and is not limited to the embodiments disclosed in the present disclosure. It should be noted that the shell 101' may be, but not limited to, round pipe-shaped, rectangular pipe-shaped, or triangular pipe-shaped.

When an electronic device 200 is mounted in the rack 300, a condensation end 112 of the heat pipe 110 is inserted in combining hole 102 and positioned in the chamber 130. In this case, an evaporation end 114 absorbs the heat energy of a heat generating element 210, and transfers the heat energy to the condensation end 112. The cooling fluid 500 exchanges heat with the condensation end 112 to remove the heat energy.

In this embodiment, the heat dissipation structure of the electronic device may further comprise a first protection gasket 106. The first protection gasket 106 is an elastic ring made of rubber or silicone, but the present disclosure is not limited thereto. The first protection gasket 106 is mounted in the combining hole 102, and the condensation end 112 extends into the chamber 130 through the first protection gasket 106. Moreover, the first protection gasket 106 has an inner diameter b, which is slightly lower than an outer diameter a of the condensation end 112 of the heat pipe 110. In other words, a close fit configuration is formed between the condensation end 112 and the first protection gasket 106. In this way, the cooler 100 allows the heat pipe 110 to be closely inserted into the combining hole 102 by additionally disposing the first protection gasket 106. In addition, the first protection gasket 106 has elasticity, thus providing a buffer effect in inserting the heat pipe 110 into the cooler 100. Therefore, using such a structure design, the damage of the heat pipe 110 due to collision caused by the rigid configuration formed by the rigid combination of the heat pipe 110 and the cooler 100 can be avoided.

Furthermore, in this embodiment, an inner shell 136 may further has a sheath 137, which is disposed in the chamber 130, and communicates with the combining hole 102. The sheath 137 isolates the cooling fluid 500 in the chamber 130, such that the cooling fluid 500 cannot flow out through the combining hole 102. When the condensation end 112 is inserted into the chamber 130, the condensation end 112 is wrapped by the sheath 137, and exchanges heat with the cooling fluid 500 by heat conduction. The length of the sheath 137 needs to be greater than the length of the condensation end 112 inserted into the chamber 130, thereby avoiding the occurrence of damage caused by collision of the sheath 137 with the condensation end 112.

Figure 5A:
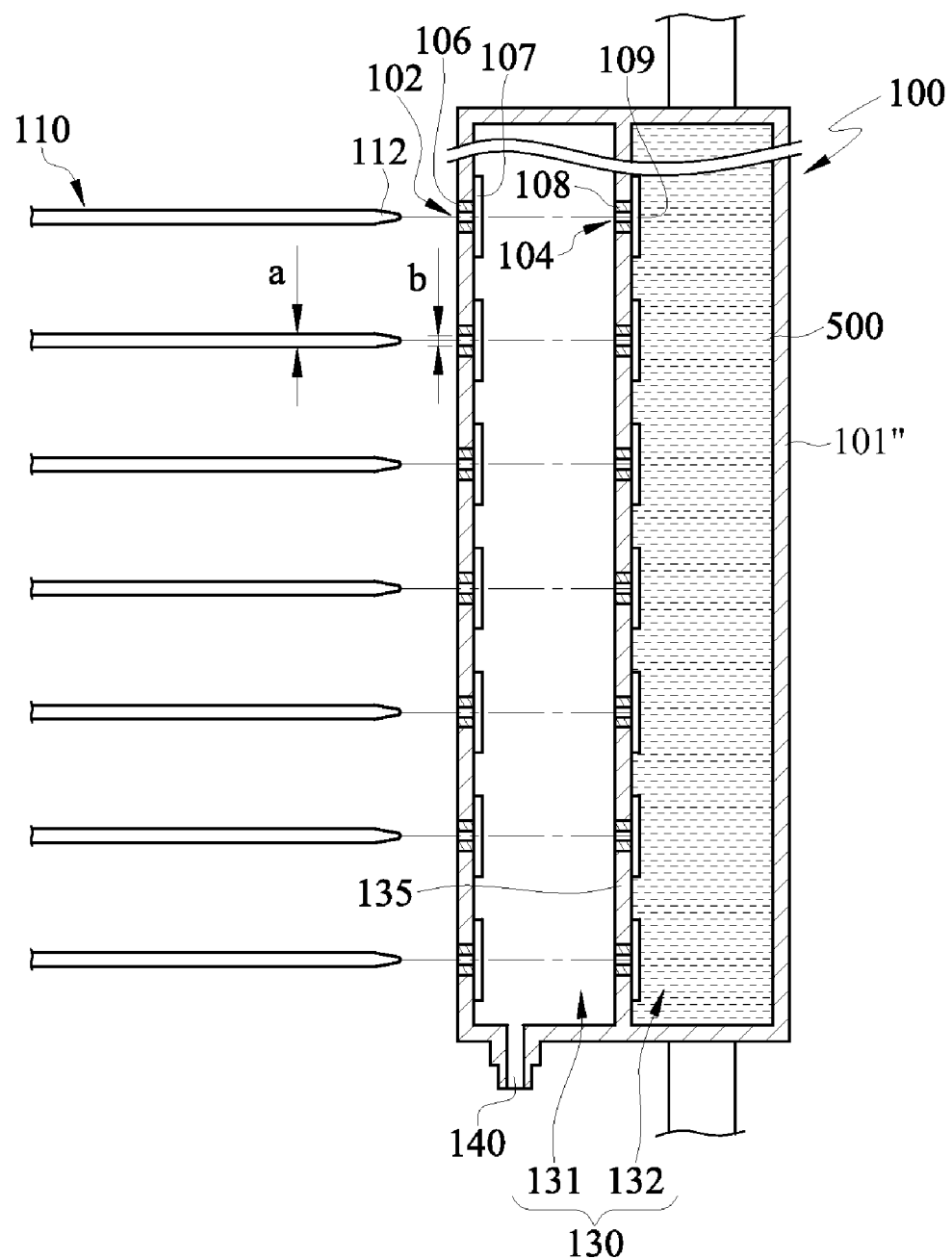
FIG. 5A is a cross-sectional view of a heat pipe and a cooler according to still another embodiment of the present disclosure.
Figure 5B:
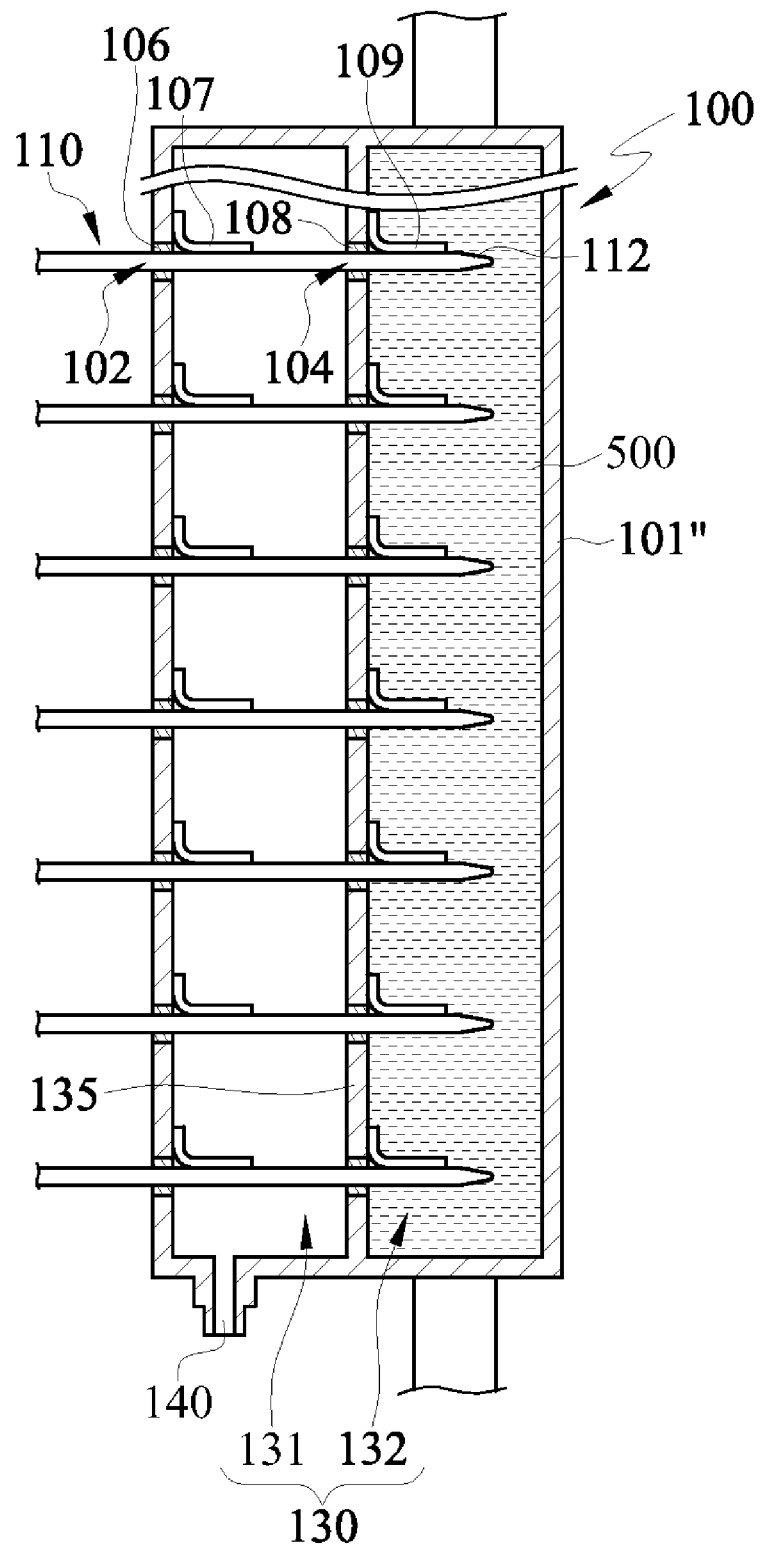
FIG. 5B is a cross-sectional view of a heat pipe and a cooler according to still another embodiment of the present disclosure.

Referring to FIGS. 5A and 5B in combination with FIG. 1A, FIGS. 5A and 5B are cross-sectional views of a heat pipe and a cooler according to still another embodiment of the present disclosure. As the structure in this embodiment is substantially similar to those in the embodiments as shown in FIGS. 3A and 3B, description is only made according to differences therebetween.

In a heat dissipation structure of an electronic device according to this embodiment, a cooler 100 comprises a shell 101", a cooling fluid 500, a combining hole 102, and a through hole 104. The shell 101" has a chamber 130, and the chamber 130 has a wall 135 therein. The wall 135 divides the chamber 130 into a cooling chamber 132 and an isolation chamber 131. The combining hole 102 communicates with the isolation chamber 131, and the cooling fluid 500 is positioned in the cooling chamber 132. In addition, the through hole 104 is positioned on the wall 135, and is coaxial with the combining hole 102. When an electronic device 200 is disposed on a rack 300, a condensation end 112 of a heat pipe 110 extends into the cooling chamber 132 sequentially through the combining hole 102 and the through hole 104. In other words, the condensation end 112 needs to extend through the isolation chamber 131 first, and then enter into the cooling chamber 132 to contact with the cooling fluid 500. It should be noted that the shell 101" may be, but not limited to, round pipe-shaped, rectangular pipe-shaped, or triangular pipe-shaped.

In this embodiment, the heat dissipation structure of the electronic device may further comprise a first protection gasket 106 and a second protection gasket 108. The first protection gasket 106 and the second protection gasket 108 are elastic rings made of rubber or silicone, but the present disclosure is not limited thereto. The first protection gasket 106 is mounted in the combining hole 102, and the second protection gasket 108 is mounted in the through hole 104. The condensation end 112 of the heat pipe 110 is extended sequentially through the first protection gasket 106 in the combining hole 102 and the second protection gasket 108 in the through hole 104, and then into the cooling chamber 132, so as to contact with the cooling fluid 500.

In addition, in this embodiment, the heat dissipation structure of the electronic device may further comprise a first one-way valve 107 and a second one-way valve 109. The first one-way valve 107 and the second one-way valve 109 may be elastic trips made of rubber; however, the present disclosure is not limited thereto. The first one-way valve 107 is disposed in the isolation chamber 131, and optionally covers the combining hole 102 (as shown in FIG. 4A). The second one-way valve 109 is disposed in the cooling chamber 132, and optionally covers the through hole 104 (as shown in FIG. 4A). When the condensation end 112 of the heat pipe 110 is inserted sequentially into the combining hole 102 and the through hole 104, the condensation end 112 pushes the first one-way valve 107 and the second one-way valve 109 away and then extends into the cooling chamber 132. In contrast, when the condensation end 112 is drawn out of the chamber 130, the first one-way valve 107 and the second one-way valve 109 automatically return to the closed state, so as to close the combining hole 102 and the through hole 104.

In the heat dissipation structure of the electronic device according to this embodiment, the chamber 130 is divided into the isolation chamber 131 and the cooling chamber 132, and the cooling fluid 500 is restricted to flow in the cooling chamber 132. Therefore, the cooling fluid 500 carelessly leaked from the cooling chamber 132 when the condensation end 112 is drawn out of the chamber 130 can be isolated in the isolation chamber 131. As a result, the damage caused to the electronic members in the electronic device 200 by the cooling fluid 500 leaked in the chamber 130 can be further avoided.

Furthermore, in this embodiment, the shell 101 may further have a water outlet 140, which communicates with the chamber 130, and is used to discharge the liquid remaining in drawing of the condensation end 112 from the chamber 130.

Figure 6A:
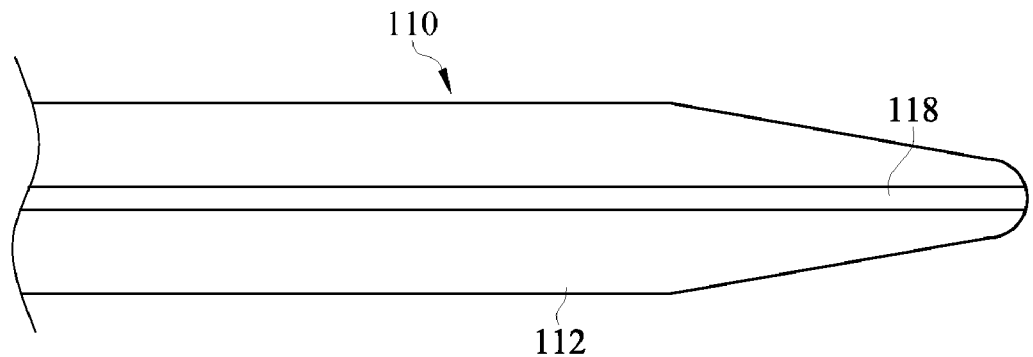
FIG. 6A is a schematic partial view of a heat pipe of a heat dissipation structure of an electronic device according to further another embodiment of the present disclosure.
Figure 6B:
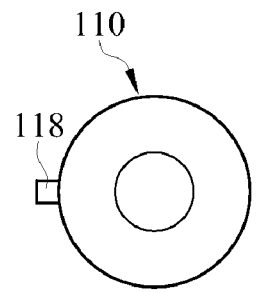
FIG. 6B is a cross-sectional view according to FIG. 6A.
Figure 6C:
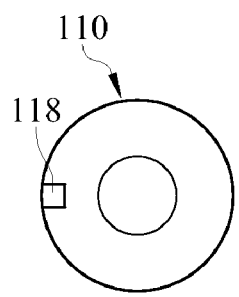
FIG. 6C is a cross-sectional view according to FIG. 6A.

Referring to FIGS. 6A to 6C, FIG. 6A is a schematic partial view of a heat pipe of a heat dissipation structure of an electronic device according to another embodiment of the present disclosure, and FIGS. 6B and 6C are cross-sectional views according to FIG. 6A.

As a heat pipe 110 is made of copper, a condensation end 112 of the heat pipe 110 is easily damaged with the long-term insertion and draw motions of the condensation end 112 into and from the cooler 100. Therefore, in the heat dissipation structure of the electronic device according to this embodiment, the heat pipe 110 may further have a rigid reinforcement member 118. The rigid reinforcement member 118 is disposed on the heat pipe 110, and extends from the condensation end 112 to the evaporation end 114 (as shown in FIG. 6A), so as to improve the rigidity of the heat pipe 110, position the heat pipe 110 and prevent the heat pipe 110 from deformation or damage. The rigid reinforcement member 118 may be directly attached on the heat pipe 110, as shown in the cross-sectional view of FIG. 6B, or embedded in the heat pipe 110, as shown in the cross-sectional view of FIG. 6C. The rigid reinforcement member 118 may be made of, but not limited to, steel alloy material, as long as a metal material has hardness better than that of the copper alloy material is selected.

According to the heat dissipation structure of the electronic device according to the above embodiment, the condensation end is directly immersed in a cooling fluid in the chamber, such that the cooling fluid can fully contact with the condensation end. Therefore, good contact effect can be achieved between the cooling fluid and the condensation end, as long as the condensation end is ensured to be positioned in the chamber, even though there is mating tolerance between the heat pipe and the cooler. Accordingly, the problem existing in the prior art of unobvious heat dissipation effect caused by the poor contact of the heat pipe with the cooler can be avoided by such a heat dissipation structure.

In addition, a protection gasket is disposed, such that the combination manner between the heat pipe and the cooler is rigid body in collision with an elastic body, and thus the damage caused to the heat pipe by collision can be lowered. Moreover, a one-way valve is additionally disposed in the chamber, so that the damage to electronic members due to leakage of the cooling fluid is further avoided.

Furthermore, in this embodiment, the chamber may be further divided into an isolation chamber and a cooling chamber, or the chamber is additionally disposed with a inner shell. Using the features above, the leakage of the cooling fluid can be avoided. In addition, together with the disposition of the one-way valve, the heat dissipation structure of this embodiment has dual mechanisms for preventing the leakage of the cooling fluid. Therefore, such a heat dissipation structure can solve the notorious problem of leakage of fluid in fluid cooling manner, and provide a good heat dissipation effect for an electronic device.

What is claimed is:

1. A heat dissipation structure of an electronic device, for dissipating heat energy of a heat generating element of at least one electronic device removably disposed in a rack, comprising:
   at least one heat pipe, having a condensation end and an evaporation end opposite to each other, wherein the evaporation end is disposed on the heat generating element; and
   a cooler, disposed on the rack, and comprising:
      a shell, having a chamber therein;
      an inner shell, disposed in the chamber, and having a cooling chamber;
      a cooling fluid, disposed in the cooling chamber;
      a combining hole, disposed on the shell, and communicating with the chamber; and
      a through hole, disposed on the inner shell, and communicating with the cooling chamber, wherein when the electronic device is mounted in the rack, the condensation end of the heat pipe is inserted into the cooling chamber sequentially through the combining hole and the through hole;
   wherein, the evaporation end absorbs the heat energy of the heat generating element, and transfers the heat energy to the condensation end, such that the cooling fluid dissipates the heat energy of the condensation end.

2. The heat dissipation structure of the electronic device according to claim 1, further comprising a cold plate, disposed on the heat generating element, and connected to the evaporation end of the heat pipe.

3. The heat dissipation structure of the electronic device according to claim 1, further comprising a first protection gasket, wherein the first protection gasket is an elastic ring disposed in the combining hole, and the condensation end of the heat pipe extends through the first protection gasket.

4. The heat dissipation structure of the electronic device according to claim 1, further comprising a first one-way valve, disposed in the chamber, and optionally covering the combining hole.

5. The heat dissipation structure of the electronic device according to claim 1, wherein the heat pipe further has a rigid reinforcement member disposed on the heat pipe.

6. The heat dissipation structure of the electronic device according to claim 1, wherein the shell further has a water outlet communicating with the chamber.

7. The heat dissipation structure of the electronic device according to claim 1, further comprising a second protection gasket, wherein the second protection gasket is an elastic ring disposed in the through hole, and the condensation end of the heat pipe extends through the second protection gasket.

8. The heat dissipation structure of the electronic device according to claim 1, further comprising a second one-way valve, disposed in the cooling chamber, and optionally covering the through hole.

9. The heat dissipation structure of the electronic device according to claim 1, further comprising a sheath, disposed in the cooling chamber, and connected to the through hole.

10. The heat dissipation structure of the electronic device according to claim 1, wherein the cooling fluid is water, a coolant, or other cooling fluids.

11. The heat dissipation structure of the electronic device according to claim 1, wherein the heat pipe is a loop heat pipe (LHP), and the condensation end of the LHP is formed of a plurality of pipes communicating with one another.

12. The heat dissipation structure of the electronic device according to claim 1, wherein the shell and the inner shell are round pipe-shaped, rectangular pipe-shaped, or triangular pipe-shaped.

13. A heat dissipation structure of an electronic device, for dissipating heat energy of a heat generating element of at least one electronic device removably disposed in a rack, comprising:
   at least one heat pipe, having a condensation end and an evaporation end opposite to each other, wherein the evaporation end is disposed on the heat generating element; and
   a cooler, disposed on the rack, and comprising:
      a shell, having a chamber therein;
      a cooling fluid, disposed in the chamber; and
      a combining hole, disposed on the shell, and communicating with the chamber, wherein when the electronic device is mounted in the rack, the condensation end of the heat pipe is inserted into the chamber through the combining hole;
   wherein the evaporation end absorbs the heat energy of the heat generating element, and transfers the heat energy to the condensation end, such that the cooling fluid dissipates the heat energy of the condensation end.

14. The heat dissipation structure of the electronic device according to claim 13, further comprising a cold plate, disposed on the heat generating element, and connected to the evaporation end of the heat pipe.

15. The heat dissipation structure of the electronic device according to claim 13, further comprising a first protection gasket, wherein the first protection gasket is an elastic ring disposed in the combining hole, and the condensation end of the heat pipe extends through the first protection gasket.

16. The heat dissipation structure of the electronic device according to claim 13, further comprising a first one-way valve, disposed in the chamber, and optionally covering the combining hole.

17. The heat dissipation structure of the electronic device according to claim 13, wherein the heat pipe further has a rigid reinforcement member disposed on the heat pipe.

18. The heat dissipation structure of the electronic device according to claim 13, further comprising a sheath, disposed in the chamber, and connected to the combining hole.

19. The heat dissipation structure of the electronic device according to claim 13, wherein the cooling fluid is water, a coolant, or other cooling fluids.

20. The heat dissipation structure of the electronic device according to claim 13, wherein the heat pipe is a loop heat pipe (LHP), and the condensation end of the LHP is formed of a plurality of pipes communicating with one another.

21. The heat dissipation structure of the electronic device according to claim 13, wherein the shell is round pipe-shaped, rectangular pipe-shaped, or triangular pipe-shaped.

22. A heat dissipation structure of an electronic device, for dissipating heat energy of a heat generating element of at least one electronic device removably disposed in a rack, comprising:
   at least one heat pipe, having a condensation end and an evaporation end opposite to each other, wherein the evaporation end is disposed on the heat generating element; and
   a cooler, disposed on the rack, and comprising:
      a shell, having a chamber therein, wherein the chamber has a wall that divides the chamber into a cooling chamber and an isolation chamber;
      a cooling fluid, disposed in the cooling chamber;

a combining hole, disposed on the shell, and communicating with the isolation chamber; and a through hole, disposed on the wall, and communicating with the cooling chamber, wherein when the electronic device is mounted in the rack, the condensation end of the heat pipe is inserted into the cooling chamber sequentially through the combining hole and the through hole;

wherein, the evaporation end absorbs the heat energy of the heat generating element, and transfers the heat energy to the condensation end, such that the cooling fluid dissipates the heat energy of the condensation end.

23. The heat dissipation structure of the electronic device according to claim 22, further comprising a cold plate, disposed on the heat generating element, and connected to the evaporation end of the heat pipe.

24. The heat dissipation structure of the electronic device according to claim 22, wherein the shell further has a water outlet communicating with the isolation chamber.

25. The heat dissipation structure of the electronic device according to claim 22, further comprising a first protection gasket, wherein the first protection gasket is an elastic ring disposed in the combining hole, and the condensation end of the heat pipe extends through the first protection gasket.

26. The heat dissipation structure of the electronic device according to claim 22, further comprising a first one-way valve, disposed in the chamber, and optionally covering the combining hole.

27. The heat dissipation structure of the electronic device according to claim 22, wherein the heat pipe further has a rigid reinforcement member disposed on the heat pipe.

28. The heat dissipation structure of the electronic device according to claim 22, further comprising a second protection gasket, wherein the second protection gasket is an elastic ring disposed in the through hole, and the condensation end of the heat pipe extends through the second protection gasket.

29. The heat dissipation structure of the electronic device according to claim 22, further comprising a second one-way valve, disposed in the cooling chamber, and optionally covering the through hole.

30. The heat dissipation structure of the electronic device according to claim 22, wherein the cooling fluid is water, a coolant, or other cooling fluids.

31. The heat dissipation structure of the electronic device according to claim 22, wherein the heat pipe is a loop heat pipe (LHP), and the condensation end of the LHP is formed of a plurality of pipes communicating with one another.

32. The heat dissipation structure of the electronic device according to claim 22, wherein the shell is round pipe-shaped, rectangular pipe-shaped, or triangular pipe-shaped.

* * * * *